United States Patent
Miyawaki et al.

(10) Patent No.: US 9,685,392 B2
(45) Date of Patent: Jun. 20, 2017

(54) RADIOFREQUENCY HIGH-OUTPUT DEVICE

(71) Applicant: Mitsubishi Electric Corporation, Tokyo (JP)

(72) Inventors: Katsumi Miyawaki, Tokyo (JP); Tatsuto Nishihara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/044,622

(22) Filed: Feb. 16, 2016

(65) Prior Publication Data

US 2016/0336255 A1    Nov. 17, 2016

(30) Foreign Application Priority Data

May 14, 2015 (JP) ................................. 2015-099254

(51) Int. Cl.
| | |
|---|---|
| H01L 23/10 | (2006.01) |
| H01L 23/34 | (2006.01) |
| H01L 23/373 | (2006.01) |
| H01L 23/13 | (2006.01) |
| H01L 23/14 | (2006.01) |
| H01L 23/40 | (2006.01) |
| H01L 23/492 | (2006.01) |
| H01L 23/043 | (2006.01) |
| H01L 21/48 | (2006.01) |

(52) U.S. Cl.
CPC ...... *H01L 23/3736* (2013.01); *H01L 21/4803* (2013.01); *H01L 23/043* (2013.01); *H01L 23/13* (2013.01); *H01L 23/142* (2013.01); *H01L 23/4006* (2013.01); *H01L 23/492* (2013.01)

(58) Field of Classification Search
CPC ............ H01L 23/3735; H01L 23/3675; H01L 23/3736
USPC ......................................................... 257/706
See application file for complete search history.

(56) References Cited

U.S. PATENT DOCUMENTS

| | | | | |
|---|---|---|---|---|
| 5,621,243 | A | * 4/1997 | Baba ................... | H01L 23/3735 257/712 |
| 2011/0298121 | A1 | 12/2011 | Nishibori et al. | |
| 2012/0299178 | A1* | 11/2012 | Kanaya ................ | H01L 23/481 257/737 |

FOREIGN PATENT DOCUMENTS

| | | |
|---|---|---|
| JP | 7-221265 | 8/1995 |
| JP | 8-204071 | 8/1996 |
| JP | 2004-172472 | 6/2004 |
| JP | 2007-012725 | 1/2007 |
| JP | 2011-253950 | 12/2011 |

* cited by examiner

*Primary Examiner* — Theresa T Doan
(74) *Attorney, Agent, or Firm* — Studebaker & Brackett PC

(57) ABSTRACT

A radiofrequency high-output device includes: a base plate having a mount portion and a flange portion; a frame joined to an upper surface of the mount portion; and a semiconductor chip mounted on the upper surface of the mount portion in the frame, wherein a cut or an aperture in which a screw is inserted to fix the base plate is provided in the flange portion, and a groove is provided between the mount portion and the flange portion of the base plate.

5 Claims, 5 Drawing Sheets

RADIOFREQUENCY HIGH-OUTPUT DEVICE

BACKGROUND OF THE INVENTION

Field of the Invention

The present invention relates to a radiofrequency high-output device.

Background Art

In a radiofrequency high-output device, terminals and a frame are brazed on a base plate, and semiconductor chips and matching circuit substrates are mounted in the frame on the base plate. A frame upper surface is covered with a cap to hermetically enclose the interior of the frame.

A CuW member, a Cu—Mo alloy member, a Cu—Mo—Cu multilayer member or the like is used as the base plate by considering heat dissipation from the semiconductor chips and matching in linear expansion coefficient between the semiconductor chips and the base plate. Schemes to develop semiconductor chips of higher outputs have recently been advanced and Cu—Mo—Cu multilayer members having a high heat dissipation characteristic are therefore used.

The base plate has cuts provided at each of its opposite shorter sides. The radiofrequency high-output device is mounted on an aluminum heat sink plate on a customer's circuit board and is fixed with screws inserted in the cuts in the base plate.

The frame is brazed on the base plate. However, the base plate is warped downward after brazing because the linear expansion coefficients of the two members are different from each other. Also, after the semiconductor chips and the matching circuit substrates are mounted with solder, complicated warps result due to a mismatch in linear expansion coefficient between the these component parts. When the device is mounted on the aluminum heat sink plate on the customer's circuit board with screws while having such warps, the warps are corrected but stresses caused in the semiconductor chips and the matching circuit substrates are increased, resulting in cracks or breakages in the component parts. A measure to improve the flatness of the frame upper surface or the base plate lower surface by plane polishing is taken in order to minimize the warp of the base plate. However, the cost of such working is considerably high.

Making thinner a peripheral portion of a heat sink on which semiconductor chips are mounted or providing a groove in the peripheral portion of the heat sink to reduce stress at the time of mounting the semiconductor chips in a device having the heat sink joined to a base plate has been proposed (see, for example, Japanese Patent Laid-Open 7-221265). However, this technique is not effective in solving the above-mentioned problem with fixing of the base plate with screws.

SUMMARY OF THE INVENTION

In view of the above-described problem, an object of the present invention is to provide a radiofrequency high-output device capable of preventing cracks or breakages in component parts when the device is mounted (secondarily mounted) on a customer's circuit board.

According to the present invention, a radiofrequency high-output device includes: a base plate having a mount portion and a flange portion; a frame joined to an upper surface of the mount portion; and a semiconductor chip mounted on the upper surface of the mount portion in the frame, wherein a cut or an aperture in which a screw is inserted to fix the base plate is provided in the flange portion, and a groove is provided between the mount portion and the flange portion of the base plate.

In the present invention, the groove is provided between the mount portion and the flange portions of the base plate. Therefore, when the base plate warped due to an initial warp of the package or mounting of the semiconductor chips and the matching circuit substrates is fixed on the aluminum heat sink plate on the circuit board with the screw, only the flange portions can easily be bent starting from the groove so that stress caused in the mount portion at the time of correcting the warp is reduced. Consequently, when the radiofrequency high-output device is mounted (secondarily mounted) on the customer's circuit board, stresses caused in the semiconductor chips and other component parts mounted on the mount portion of the base plate can be reduced to prevent cracks or breakages in the component parts.

Other and further objects, features and advantages of the invention will appear more fully from the following description.

DETAILED DESCRIPTION OF THE PREFERRED EMBODIMENTS

A radiofrequency high-output device according to the embodiments of the present invention will be described with reference to the drawings. The same components will be denoted by the same symbols, and the repeated description thereof may be omitted.

First Embodiment

Figure 1:
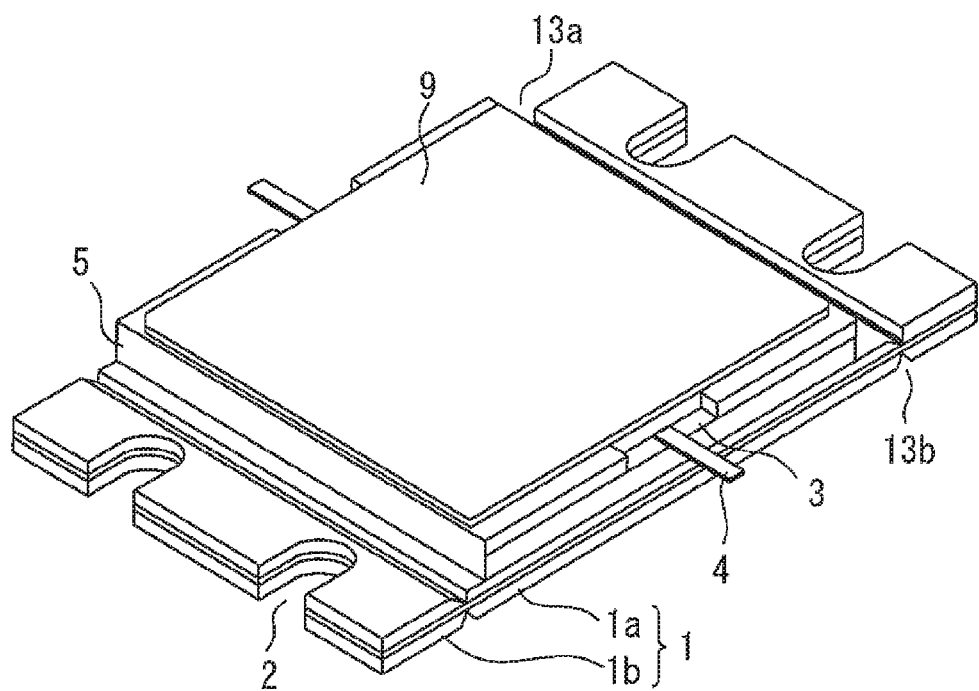
FIG. 1 is a perspective view of a radiofrequency high-output device according to a first embodiment of the present invention.
Figure 2:
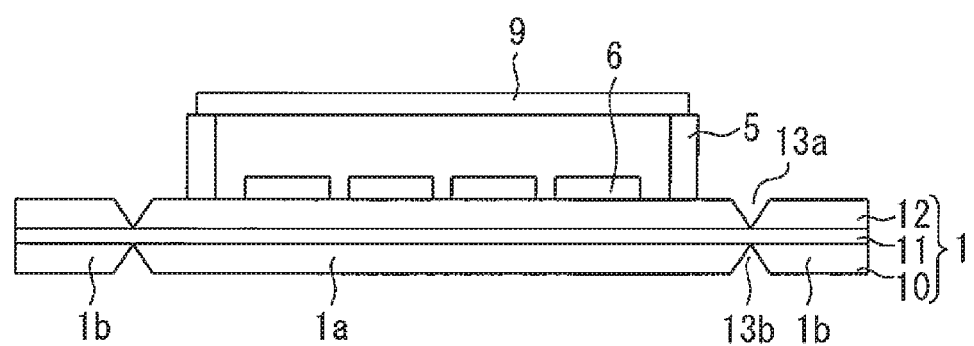
FIG. 2 is a sectional view of a radiofrequency high-output device according to a first embodiment of the present invention.
Figure 3:
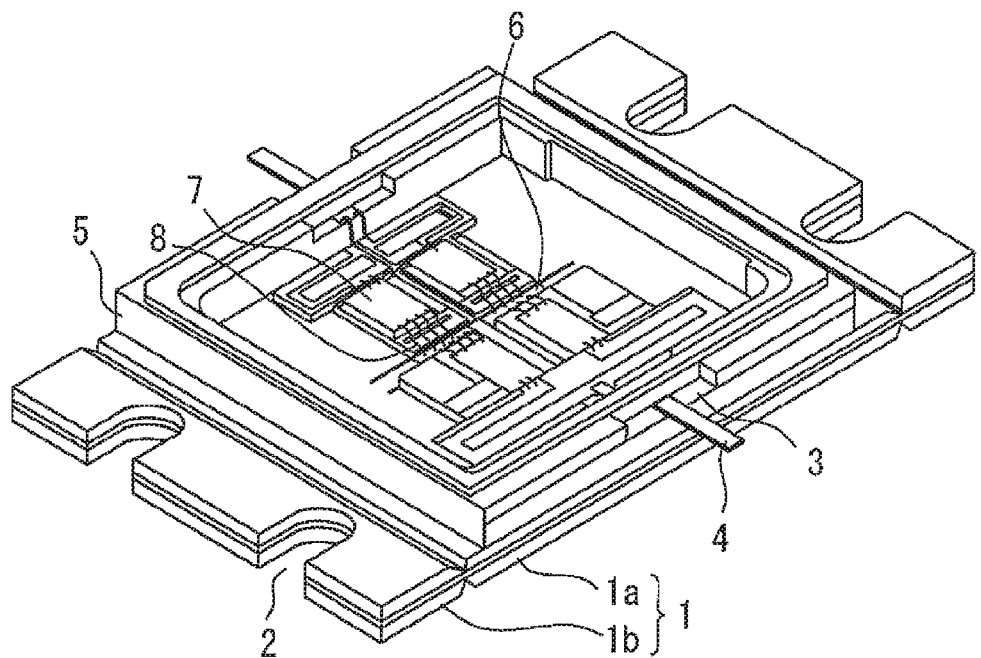
FIG. 3 is a perspective view showing an internal portion of the radiofrequency high-output device according to the first embodiment of the present invention.
Figure 4:
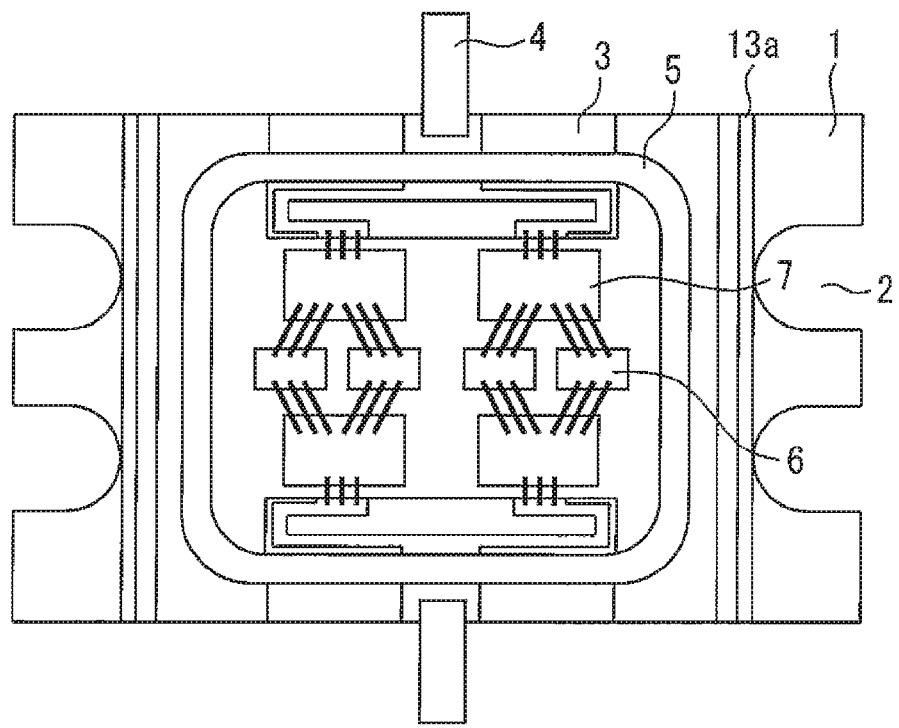
FIG. 4 is a sectional view showing an internal portion of the radiofrequency high-output device according to the first embodiment of the present invention.

FIGS. 1 and 2 are a perspective view and a sectional view, respectively, of a radiofrequency high-output device according to a first embodiment of the present invention. FIGS. 3 and 4 are a perspective view and a sectional view each showing internal portions of the radiofrequency high-output device according to the first embodiment of the present invention.

A base plate 1 has a mount portion 1a and flange portions 1b. The mount portion 1a is disposed at a center of the base plate 1 in a direction along longer sides of the base plate 1, and the flange portions 1b are disposed on opposite sides of the mount portion 1a. Cuts 2 in which screws are inserted to fix the base plate 1 are provided in the flange portions 1b. In this embodiment, the cut 2 is provided in at least one place at each of the opposite shorter sides of the base plate 1. An aperture may be provided in place of the cut 2.

On an upper surface of the mount portion 1a of the base plate 1, ceramic terminals 3 and metal leads 4 are placed and a ceramic or metal frame 5 is joined to the upper surface by brazing. With the frame 5, the base plate 1 and the ceramic terminals 3 are fixed to each other. An assembly of the above-described construction is generally called a semiconductor package.

In the frame 5 of this semiconductor package, semiconductor chips 6 and matching circuit substrates 7 are mounted on the upper surface of the mount portion 1a with a solder material or a resin material. The semiconductor chips 6 and the matching circuit substrates 7 are connected to each other by gold wires 8 to form an electrical circuit. For the matching circuit substrate 7, a ceramic material, for example, is used. A metallic or ceramic cap 9 is joined to the frame 5 by soldering or electric welding to hermetically enclose the interior of the cavity. The frame 5 and the cap 9 protect the semiconductor chips 6 and other components from external force.

The base plate 1 is formed of a Cu—Mo—Cu multilayer member having a Cu plate 10, an Mo plate 11 and a Cu plate 12 stacked in this order with a brazing material, which member is selected by considering heat dissipation from the semiconductor chips 6 and matching in linear expansion coefficient with the semiconductor chips 6.

V-grooves 13a and 13b are provided in positions corresponding to each other in the vertical direction in the upper and lower surfaces of the base plate 1 between the mount portion 1a and the flange portions 1b of the base plate 1. The V-grooves 13a and 13b are provided in the Cu plates 12 and 10, respectively. The depths of the V-grooves 13a and 13b may be such that the V-grooves 13a and 13b reach or do not reach the Mo plate 11. The V-grooves 13a and 13b may have U-shaped cross sections or certain recessed cross sections. The shapes of the V-grooves 13a and 13b are not specially specified.

Figure 5:
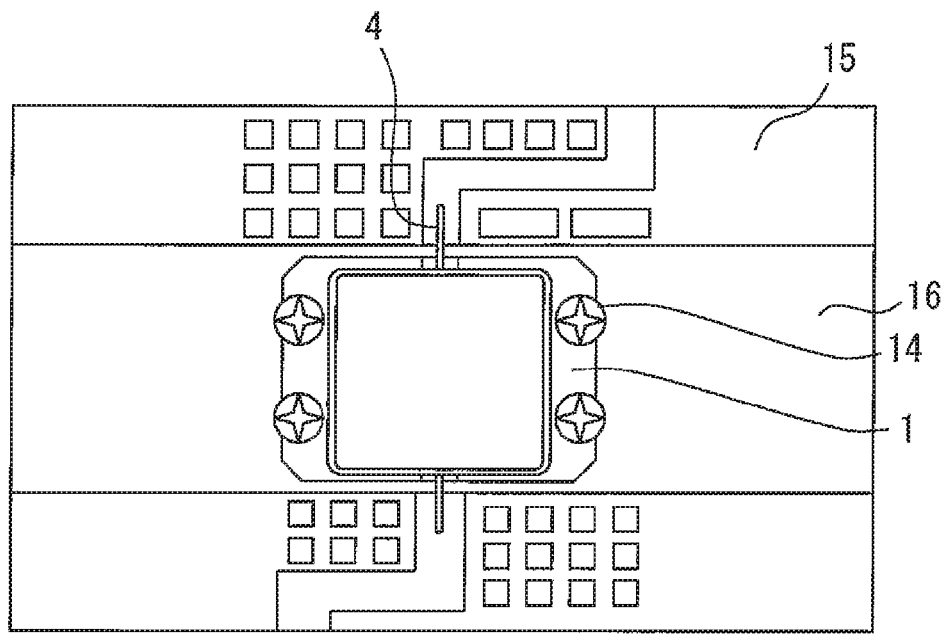
FIG. 5 is a top view of the radiofrequency high-output device according to the first embodiment of the present invention and a customer's circuit board, showing a state where the radiofrequency high-output device is mounted on the customer's circuit board.
Figure 6:
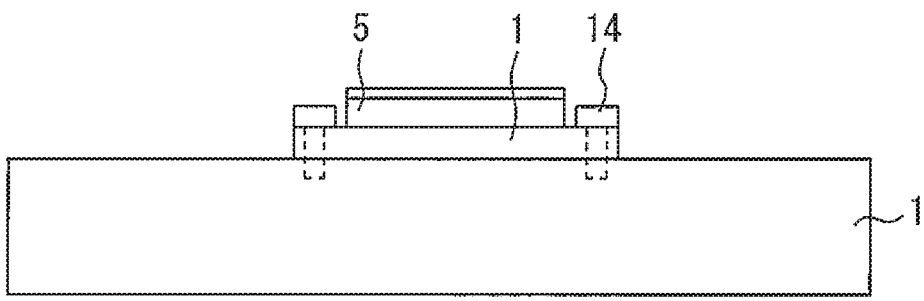
FIG. 6 is a side view of the radiofrequency high-output device according to the first embodiment of the present invention and a customer's circuit board, showing a state where the radiofrequency high-output device is mounted on the customer's circuit board.

FIGS. 5 and 6 are a top view and a side view, respectively, of the radiofrequency high-output device according to the first embodiment of the present invention and a customer's circuit board, showing a state where the radiofrequency high-output device is mounted on the customer's circuit board. The base plate 1 is fixed on an aluminum heat sink plate 16 on the customer's circuit board 15 with screws 14 inserted in the cuts 2 in the flange portions 1b. Connections are established between the metal leads 4 and the customer's circuit board 15 by means of solder. The electrical circuit in the semiconductor package is thereby connected to a customer's circuit via the ceramic terminals 3 and the metal leads 4.

Figure 7:
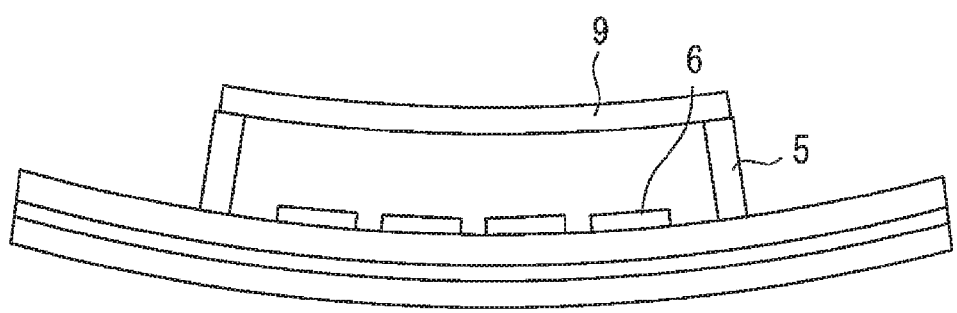
FIG. 7 is a sectional view showing a radiofrequency high-output device according to the comparative example.
Figure 8:
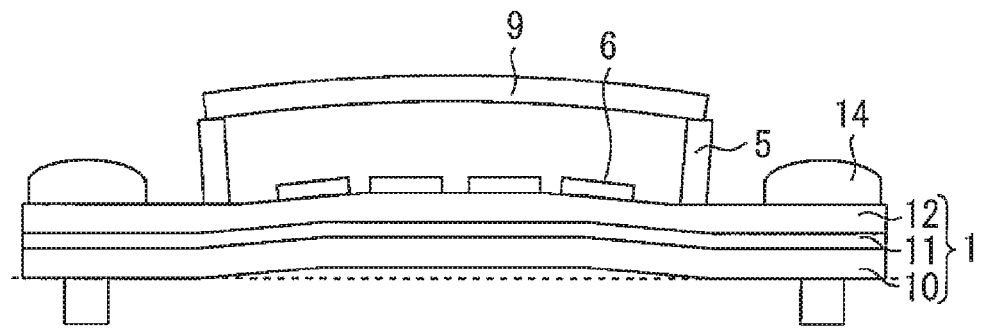
FIG. 8 is a sectional view of the radiofrequency high-output device according to the comparative example and a customer's circuit board, showing a state where the radiofrequency high-output device is mounted on the customer's circuit board.

The effect of the present embodiment will subsequently be described by comparing the present embodiment with a comparative example. FIG. 7 is a sectional view showing a radiofrequency high-output device according to the comparative example. FIG. 8 is a sectional view of the radiofrequency high-output device according to the comparative example and a customer's circuit board, showing a state where the radiofrequency high-output device is mounted on the customer's circuit board. V-grooves 13a and 13b are not provided in the comparative example.

When the base plate 1, the ceramic terminals 3 and the frame 5 are assembled, a brazing process is performed at a high temperature. In the brazing process, the base plate 1 is warped because stress is caused due to a difference in linear expansion coefficient particularly between the Cu plates 10 and 12 and the frame 5 made of a Fe-based alloy or a ceramic for example in the Cu—Mo—Cu multilayer member. When the warped base plate 1 is fixed on the aluminum heat sink plate 16 on the customer's circuit board 15 with the screws 14, the entire base plate 1 is set right to a state close to the plane. In the comparative example, however, stresses caused in the semiconductor chips 6 and the matching circuit substrates 7 are increased to cause cracks or breakages in the component parts.

On the other hand, in the present embodiment, the V-grooves 13a and 13b are provided between the mount portion 1a and the flange portions 1b of the base plate 1. Therefore, when the base plate 1 warped due to an initial warp of the package or mounting of the semiconductor chips 6 and the matching circuit substrates 7 is fixed on the aluminum heat sink plate 16 on the circuit board 15 with the screws 14, only the flange portions 1b can easily be bent starting from the V-grooves 13a and 13b so that stress caused in the mount portion 1a at the time of correcting the warp is reduced. Consequently, when the radiofrequency high-output device is mounted (secondarily mounted) on the customer's circuit board 15, stresses caused in the semiconductor chips 6 and other component parts mounted on the mount portion 1a of the base plate 1 can be reduced to prevent cracks or breakages in the component parts.

Second Embodiment

Figure 9:
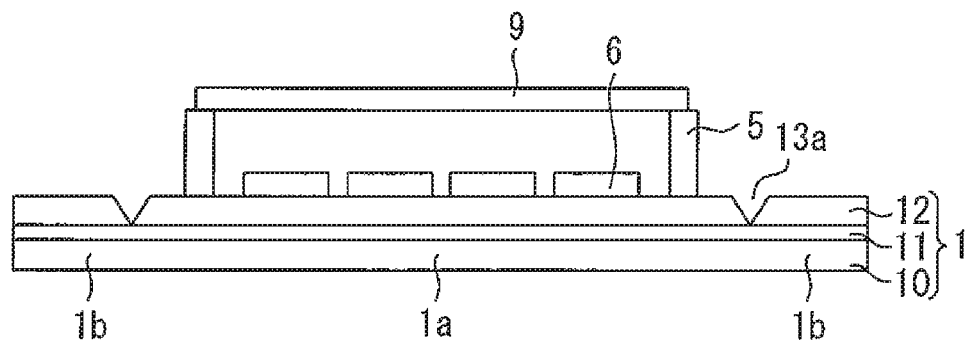
FIG. 9 is a sectional view of a radiofrequency high-output device according to a second embodiment of the present invention.

FIG. 9 is a sectional view of a radiofrequency high-output device according to a second embodiment of the present invention. In the second embodiment, V-grooves 13a are provided only in the upper surface of the base plate 1 between the mount portion 1a and the flange portions 1b of the base plate 1. The V-grooves 13a are provided in the Cu plate 12. The depths of the V-grooves 13a may be such that the V-grooves 13a reach or do not reach the Mo plate 11. The V-grooves 13a may have U-shaped cross sections or certain recessed cross sections. The shapes of the V-grooves 13a are not specially specified. The flange portions 1b are enabled to bend easily starting from the V-grooves 13a. An effect similar to that in the first embodiment can thus be obtained.

Third Embodiment

Figure 10:
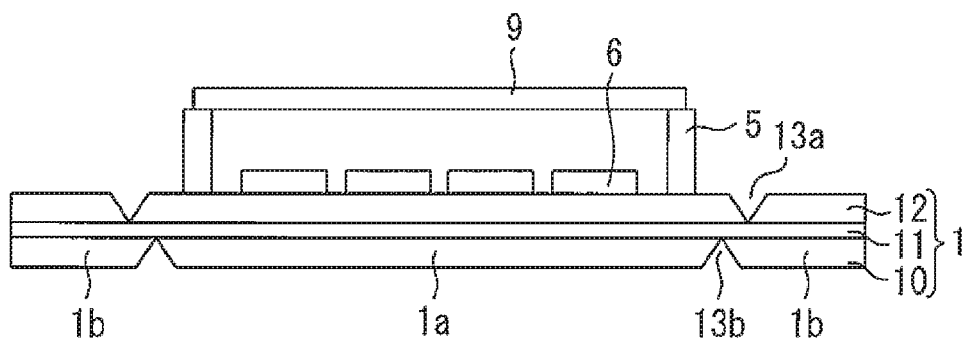
FIG. 10 is a sectional view of a radiofrequency high-output device according to a third embodiment of the present invention.

FIG. 10 is a sectional view of a radiofrequency high-output device according to a third embodiment of the present invention. In the third embodiment, V-grooves 13a and 13b are provided in positions not corresponding to each other in the vertical direction in the upper and lower surfaces of the base plate 1 between the mount portion 1a and the flange portions 1b of the base plate 1. The V-grooves 13a and 13b are provided in the Cu plates 12 and 10, respectively. The depths of the V-grooves 13a and 13b may be such that the V-grooves 13a and 13b reach or do not reach the Mo plate 11. The V-grooves 13a and 13b may have U-shaped cross sections or certain recessed cross sections. The shapes of the V-grooves 13a and 13b are not specially specified.

The flange portions 1b are enabled to bend easily starting from the V-grooves 13a and 13b. An effect similar to that in the first embodiment can thus be obtained. The provision of the V-grooves 13a and 13b in positions not corresponding to each other in the vertical direction in the upper and lower surfaces of the base plate 1 ensures that an optimum warp correction according to the warpage of the base plate 1 can be made.

Fourth Embodiment

Figure 11:
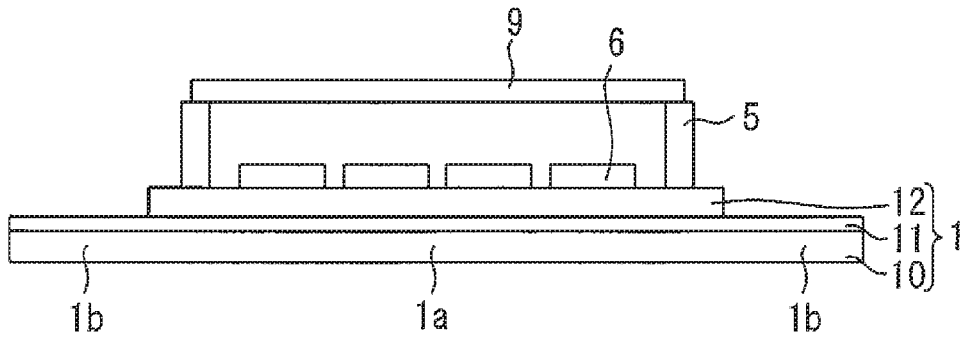
FIG. 11 is a sectional view of a radiofrequency high-output device according to a fourth embodiment of the present invention.

FIG. 11 is a sectional view of a radiofrequency high-output device according to a fourth embodiment of the present invention. In the fourth embodiment, the entire Cu plates 12 on the upper surface side of the flange portions 1b of the base plate 1 are removed and the flange portions 1b are formed only of the Mo plates 11 and the Cu plates 10 on the lower surface side. The flange portions 1b are thereby enabled to bend easily. An effect similar to that in the first embodiment can thus be obtained.

Fifth Embodiment

Figure 12:
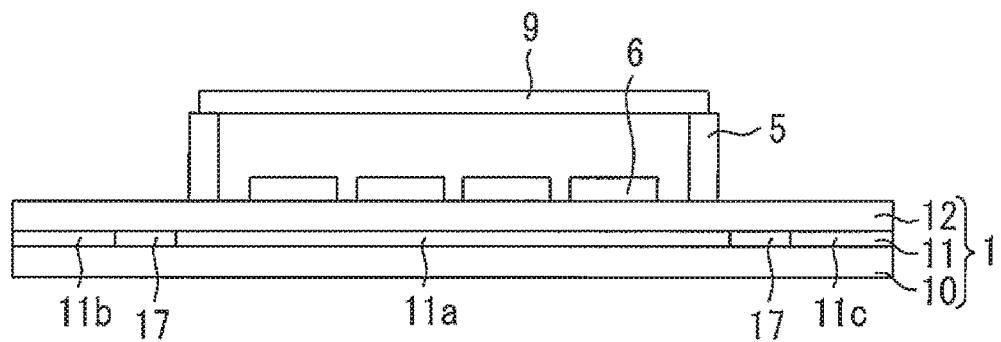
FIG. 12 is a sectional view of a radiofrequency high-output device according to a fifth embodiment of the present invention.
Figure 13:
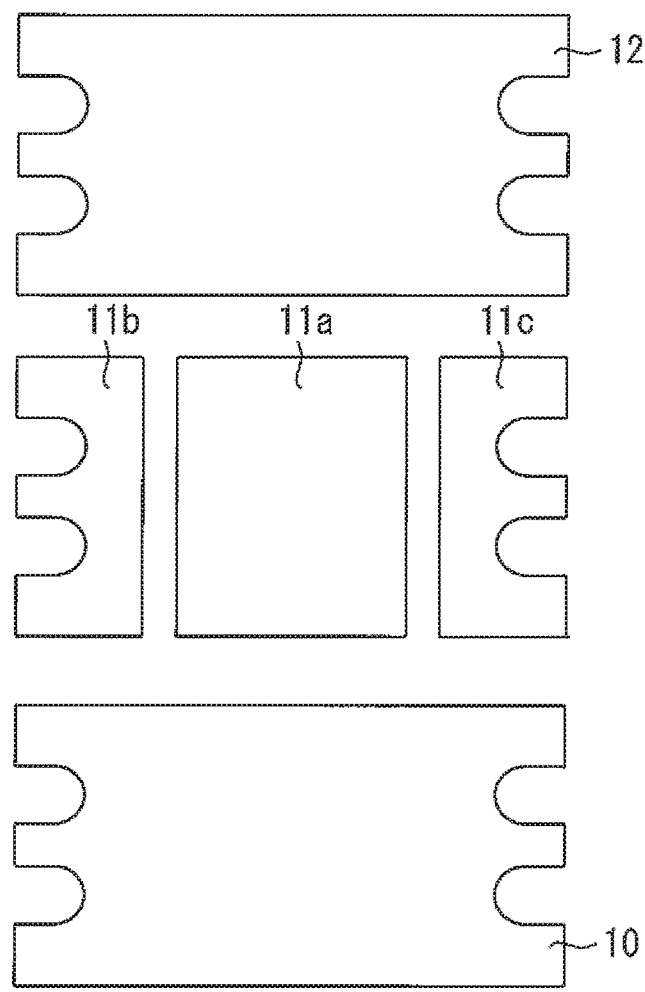
FIG. 13 is a plan view of an Mo plate and Cu plates forming a base plate of the radiofrequency high-output device according to the fifth embodiment of the present invention.

FIG. 12 is a sectional view of a radiofrequency high-output device according to a fifth embodiment of the present invention. FIG. 13 is a plan view of an Mo plate and Cu plates forming a base plate of the radiofrequency high-output device according to the fifth embodiment of the present invention.

In the fifth embodiment, the Mo plate 11 in the base plate 1 is formed of three plates: an Mo plate 11a as long as or slightly longer than the contour of the frame in the longitudinal direction and Mo plates 11b and 11c having the same contours as those of the flange portions 1b on opposite sides. The base plate 1 is a Cu—Mo—Cu multilayer plate having the Mo plate 11 interposed between the Cu plate 10 and the Cu plate 12. The Mo plate 11 is divided at positions between the mount portion 1a and the flange portions 1b of the base plate 1. Spaces 17 surrounded by the divided portions of the Mo plate 11 and the upper and lower Cu plates 12 and 10 are filled with a brazing material or the like used when the layers of the Cu—Mo—Cu multilayer member are stacked.

In the Cu—Mo—Cu multilayer member, the Mo plate 11 has an elastic modulus higher than that of the Cu plates 10 and 12 and difficult to bend in comparison with the Cu plates 10 and 12. The Mo plate 11 is therefore divided by removing its portions between the mount portion 1a and the flange portions 1b of the base plate 1. The flange portions 1b can bend easily starting from the divided portions of the Mo plate 11. An effect similar to that in the first embodiment can thus be obtained.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2015-099254, filed on May 14, 2015 including specification, claims, drawings and summary, on which the Convention priority of the present application is based, is incorporated herein by reference in its entirety.

What is claimed is:

1. A radiofrequency high-output device comprising:
a base plate having a mount portion and a flange portion;
a frame joined to an upper surface of the mount portion; and
a semiconductor chip mounted on the upper surface of the mount portion in the frame,
wherein a cut or an aperture in which a screw is inserted to fix the base plate is provided in the flange portion, and
a groove is provided between the mount portion and the flange portion of the base plate.

2. The radiofrequency high-output device of claim 1, wherein the groove includes first and second grooves provided in positions corresponding to each other in a vertical direction in upper and lower surfaces of the base plate.

3. The radiofrequency high-output device of claim 1, wherein the groove is provided only in an upper surface of the base plate.

4. The radiofrequency high-output device of claim 1, wherein the groove includes first and second grooves provided in positions not corresponding to each other in a vertical direction in upper and lower surfaces of the base plate.

5. The radiofrequency high-output device of claim 1, wherein
the base plate includes upper and lower surfaces, said upper surface including the upper surface of the mount portion, and
the groove is provided in at least one of the upper and lower surfaces of the base plate and is positioned between the mount portion and the flange portion of the base plate.

* * * * *